(12) United States Patent
Vethake et al.

(10) Patent No.: US 12,603,474 B2
(45) Date of Patent: Apr. 14, 2026

(54) HIGH ACCURACY QCW PITCH STACK USING SINTER JOINTS

(71) Applicant: TRUMPF Photonics, Inc., Cranbury, NJ (US)

(72) Inventors: Thilo Vethake, Roosevelt, NJ (US); Tobias Barnowski, East Windsor, NJ (US); Katherine Atwater, Plainsboro, NJ (US); Eric Zanghi, Plainsboro, NJ (US)

(73) Assignee: TRUMPF PHOTONICS, INC., Cranbury, NJ (US)

(*) Notice: Subject to any disclaimer, the term of this patent is extended or adjusted under 35 U.S.C. 154(b) by 565 days.

(21) Appl. No.: 18/172,342

(22) Filed: Feb. 22, 2023

(65) Prior Publication Data

US 2024/0283214 A1      Aug. 22, 2024

(51) Int. Cl.
| | |
|---|---|
| H01S 5/024 | (2006.01) |
| H01S 5/02253 | (2021.01) |
| H01S 5/02315 | (2021.01) |
| H01S 5/40 | (2006.01) |

(52) U.S. Cl.
CPC ...... H01S 5/02469 (2013.01); H01S 5/02253 (2021.01); H01S 5/02315 (2021.01); H01S 5/4031 (2013.01)

(58) Field of Classification Search
CPC ............. H01S 5/02315; H01S 5/02469; H01S 5/02476; H01S 5/4031–4043
See application file for complete search history.

(56) References Cited

U.S. PATENT DOCUMENTS

| | | | | |
|---|---|---|---|---|
| 4,716,568 | A | * | 12/1987 | Scifres ................... H01S 5/023 |
| | | | | 372/36 |
| 5,394,426 | A | * | 2/1995 | Joslin .................... H01S 5/4031 |
| | | | | 372/50.12 |
| 6,124,973 | A | | 9/2000 | Du et al. |
| 6,240,116 | B1 | | 5/2001 | Lang et al. |
| 2007/0195850 | A1 | | 8/2007 | Schluter et al. |
| 2007/0217467 | A1 | * | 9/2007 | DeFranza ............. H01S 5/4025 |
| | | | | 372/50.12 |

(Continued)

FOREIGN PATENT DOCUMENTS

| | | | | |
|---|---|---|---|---|
| DE | 19744281 | A1 | * | 6/1999 ............. H01S 5/024 |
| DE | 102015013511 | B3 | * | 3/2017 ........... H01S 5/0237 |

*Primary Examiner* — James A Menefee
(74) *Attorney, Agent, or Firm* — LEYDIG, VOIT & MAYER, LTD.

(57) ABSTRACT

A light emitting device, including a plurality of emitter subassemblies and a lens array, each emitter subassembly including a plate-shaped light emitter having two sides and configured to emit light from an edge, and at least one plate-shaped submount attached to at least one side of the plate-shaped light emitter. Each of the plurality of emitter subassemblies are disposed parallel to one another and sintered to one another in such a manner as to form a light emitting diode stack. A predefined pitch pattern defines distances between adjacent emitter subassemblies. The lens array is mounted on the light emitting diode stack and includes a plurality of lenses combined as a single unitary body. Distances between the lenses correspond to the distances defined by the predefined pitch pattern such that each of the plurality of lenses is aligned with a corresponding one of the plate-shaped light emitters.

17 Claims, 9 Drawing Sheets

(56)        References Cited

U.S. PATENT DOCUMENTS

| | | | |
|---|---|---|---|
| 2012/0140334 A1* | 6/2012 | McBride ............ | G02B 27/0966 |
| | | | 65/29.11 |
| 2021/0119413 A1 | 4/2021 | Strohmaier et al. | |
| 2021/0249838 A1* | 8/2021 | Schwarz .............. | H01S 5/0238 |
| 2021/0257807 A1 | 8/2021 | Strohmaier et al. | |

* cited by examiner

18

20

22

1

HIGH ACCURACY QCW PITCH STACK USING SINTER JOINTS

FIELD

The present invention relates to a high accuracy laser diode stack and a method for manufacturing the same.

BACKGROUND

Quasi-continuous wave (QCW) lasers are assembled as stacks of parallel edge-emitting diodes. The QCW laser stacks include subassemblies with submounts and diodes that are joined to one another to form the stack. Typically, the subassemblies are joined via reflow soldering to ensure complete electrical and thermal coverage between subassemblies. Soldered QCW stacks, however, create challenges during assembly that can cause QCW stack manufacturing to become time-consuming and costly. For example, stack assemblies can become misaligned or have large tolerances, making it difficult to control quality during assembly. Furthermore, a small deviation in spacing between two subassemblies in a stack can result in additive differences that become large over the entire stack. Likewise, deviations in thickness of subassemblies can cumulatively result in highly variable stack thickness. Variations in thickness tend to result in a plurality of stacks that are either all too thick or all to thin, leading to large overall dimensional variations of completed stacks. Even in the improbable case where variations cancel each other out to result in a proper overall stack dimension, pitch variations between subassemblies necessitate mounting of individual lenses for each diode in the stack if a high beam quality is required. Furthermore, once a stack is formed using soldering, tolerances are typically become high enough that mounting of individual lenses for each diode in the stack is required. The mounting of individual lenses also adds both time and expense to a QCW stack manufacturing process. Thus, improvements in the tolerances of QCW stacks, in the tolerances of individual subassemblies of QCW stacks, and the methods for manufacturing QCW stacks are needed.

SUMMARY

A light emitting device, comprising a plurality of emitter subassemblies, each emitter subassembly including a plate-shaped light emitter having two sides and configured to emit light from an edge disposed between the two sides, and at least one plate-shaped submount attached to at least one side of the plate-shaped light emitter. Each of the plurality of emitter subassemblies are disposed parallel to one another and sintered to one another in such a manner as to form a light emitting diode stack. A predefined pitch pattern defines distances between adjacent emitter subassemblies. The light emitting device also comprises a lens array mounted on the light emitting diode stack, wherein the lens array includes a plurality of lenses combined as a single unitary body. Distances between the lenses correspond to the distances defined by the predefined pitch pattern such that each of the plurality of lenses is aligned with a corresponding one of the plate-shaped light emitters.

BRIEF DESCRIPTION OF THE DRAWINGS

Subject matter of the present disclosure will be described in even greater detail below based on the exemplary figures. All features described and/or illustrated herein can be used

Figure 1A:
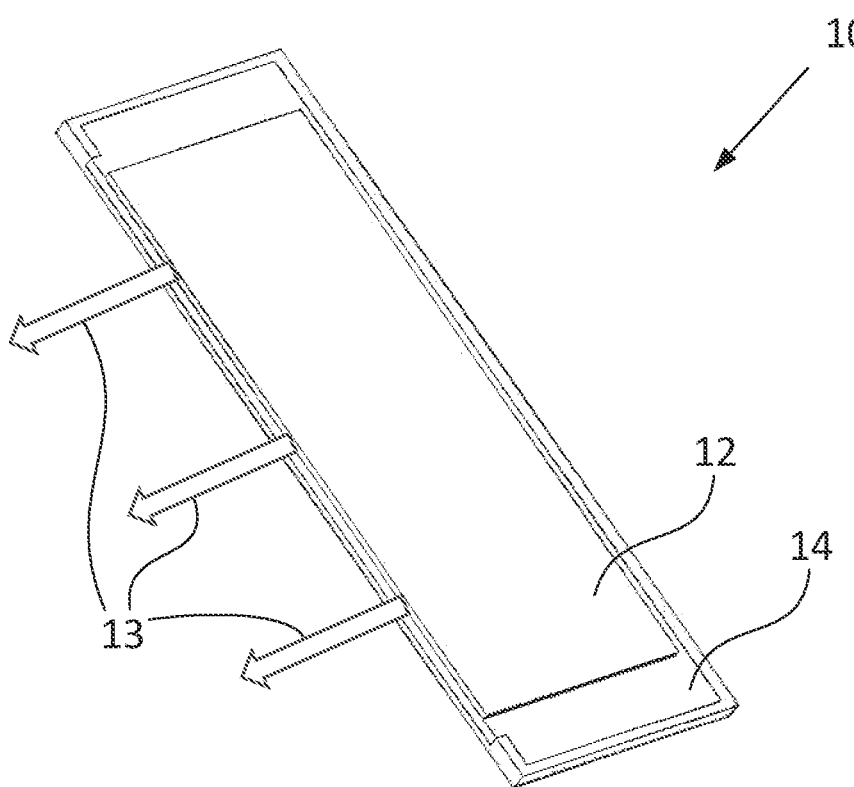
Figure 1B:
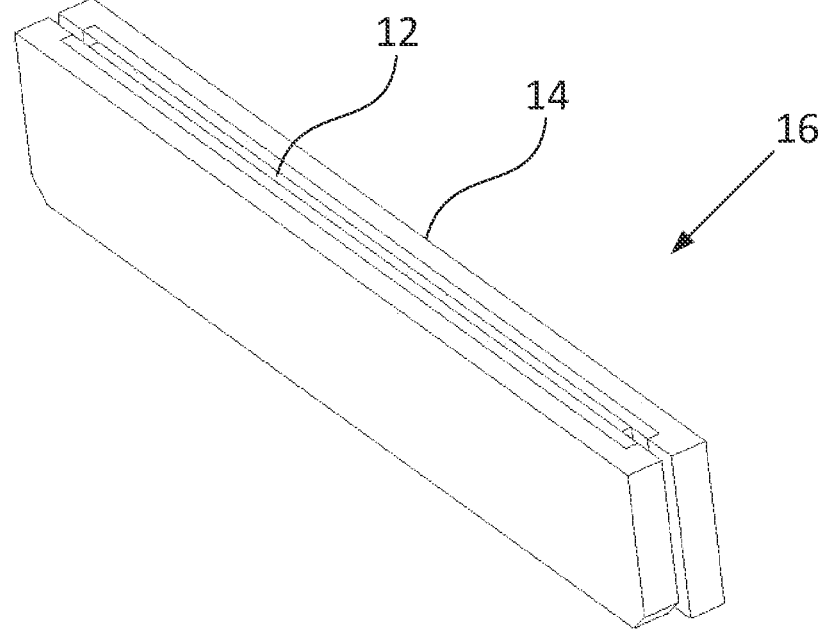
Figure 1C:
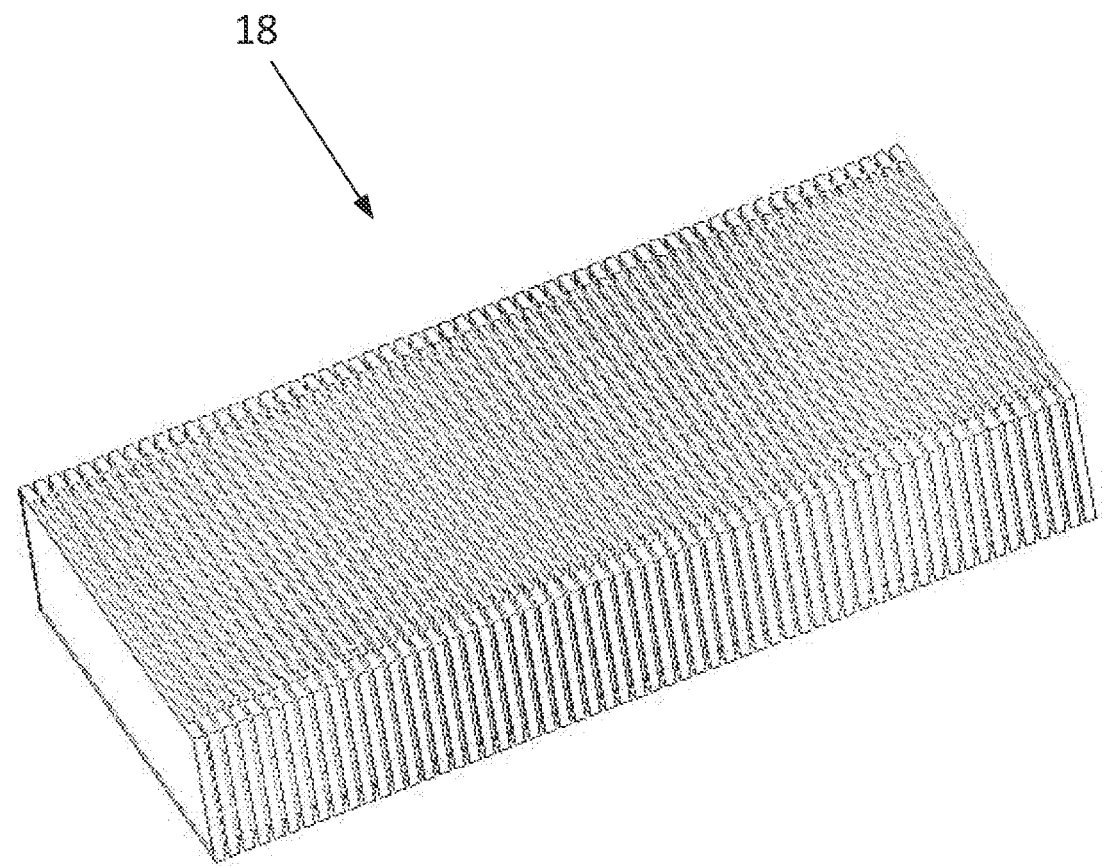
Figure 2:
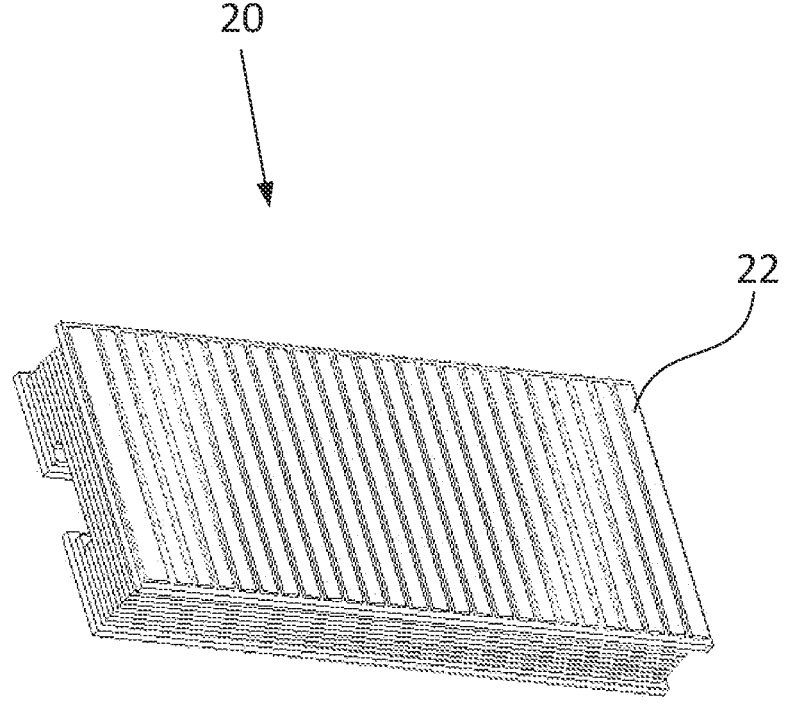
Figure 4A:
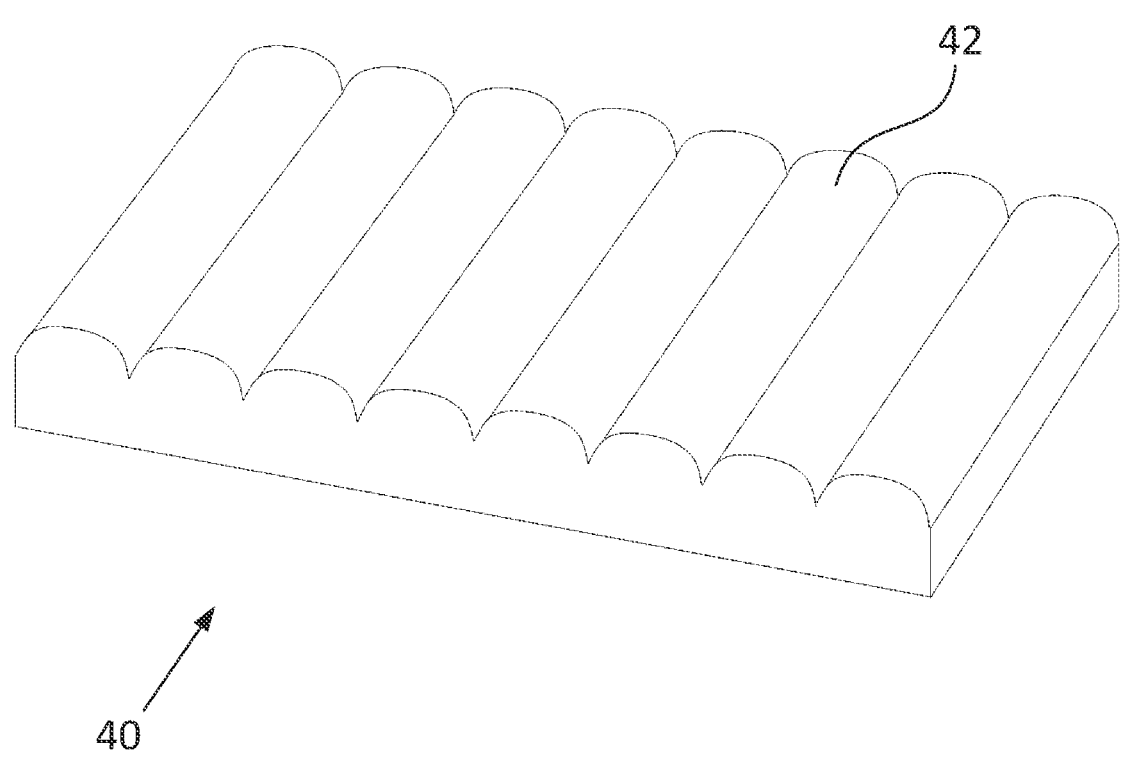
Figure 4B:
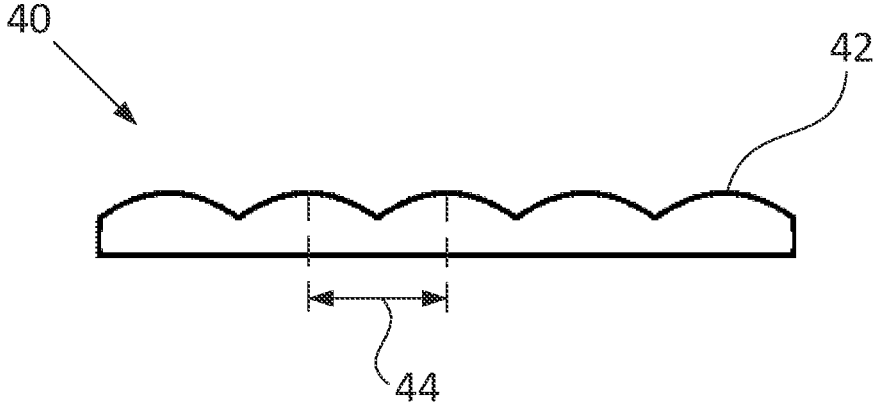

2 alone or combined in different combinations. The features and advantages of various embodiments will become apparent by reading the following detailed description with reference to the attached drawings, which illustrate the following:

FIGS. 1a-1b illustrate emitter subassemblies according to aspects of the disclosure:

FIG. 1c illustrates a laser stack according to an aspect of the disclosure;

FIG. 2 illustrates a cooler according to an aspect of the disclosure;

FIGS. 3a-3d illustrate laser devices according to aspects of the disclosure:

FIGS. 4a-4b illustrate lens arrays according to aspects of the disclosure; and

Figure 5A:
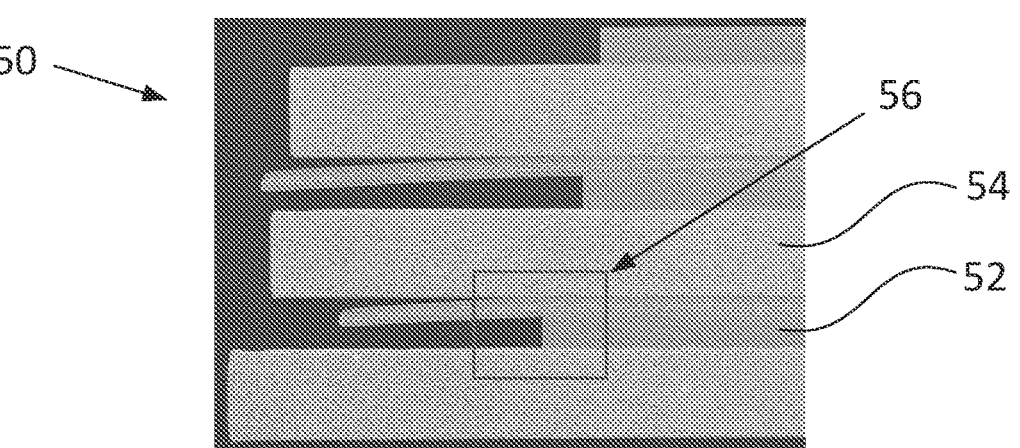
Figure 5B:
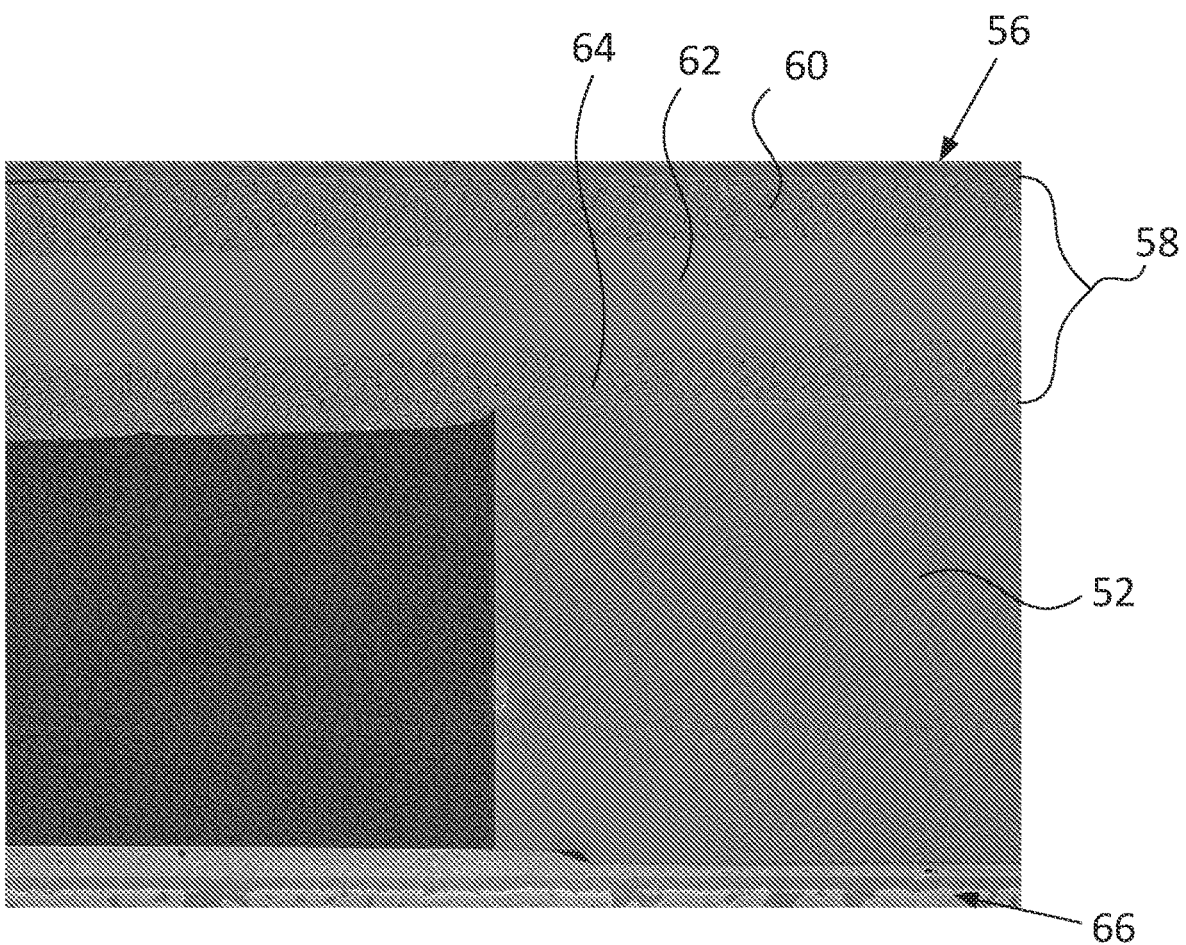

FIGS. 5a-5b illustrate an electron microscope scan of joined emitter subassemblies according to an aspect of the disclosure.

DETAILED DESCRIPTION

Embodiments of the present disclosure improve the tolerances in light emitting stacks, such as QCW "backplane cooled" laser stacks. The tolerances pose challenges because narrow pitch patterns have to match up between a stack and the top metallization of the cooler. This creates challenges in the assembly process of those components. Furthermore, when laser stacks are fitted with lenses, each light emitting subcomponent of a laser stack has to be lensed individually, creating challenges due to very small pitch distances. This process is very labor intensive in comparison to a process which can instead use a lens array. Embodiments of the present disclosure thus provide a high accuracy pitch stack, enabling the usage of lens arrays to reduce manufacturing and labor costs while maintaining a comparable beam quality to laser stacks with individually mounted lenses.

In an embodiment, laser stacks are formed by first mounting a laser diode onto a submount with a first joining method. A second submount can be added using a second joining method. The first and second joining methods can be the same method or different methods. In some embodiments, an insulator may be attached via a third method to the bottom of a submount. The third joining method can also join submount assemblies of the submounts and laser diodes into smaller stacks. The laser stack is then stacked on a cooler. The bottom of the laser stack will be connected with the cooler using a fourth joining method.

If the laser stack does not already have an insulator attached, an insulator can be attached while joining the uninsulated laser stack to the cooler by adding an insulator (or multiple insulators) between the laser stack and the cooler. If each of the four joining methods described above are carried out via soldering, solder from the first and second joining methods may liquefy during the third and fourth joining methods, and the tolerances of parts will stack up. As a result the total size of the laser stack may vary by as much as 100 micrometers or a multiple thereof. In conventionally produced laser stacks, local tolerances may range between 20 micrometers to 200 micrometers. That is, the deviation with respect to distance between adjacent laser diodes in a laser stack (or, as described in greater hereinafter, the pitch between adjacent laser diodes or their assemblies) between the desired distance between adjacent laser diodes in a laser stack may vary from 20 to 200 micrometers. Such high tolerances lead to inefficiencies and quality control issues during manufacturing. Furthermore, lens arrays cannot be used and individual lenses must be mounted, as lens arrays having a precisely prefabricated pitch between lenses cannot be mounted to a laser stack without more tightly controlled tolerances. Likewise, prefabricated coolers require tight and predictable tolerances for joining metallized contacts of a cooler to the laser stack.

In an embodiment, the present disclosure addresses the foregoing shortcomings of conventional laser stacks by employing sintering instead of soldering for at least some of the joining methods. In general, sintering is a joining process involving application of pressure (e.g. via compression of parts to be joined) and heat to join solid particles without melting the solid particles. The compression ratio employed during sintering may vary without affecting functionality of a sintered laser stack manufactured with low dimensional tolerances. The compression ratio is defined by a post-compression thickness of parts divided by the original thickness of the parts pre-compression. Thus, in the present context, the compression ratio represents a value equal to the a thickness of a laser stack after compression divided by the original thickness of the laser stack before compression. Sintering ensures that the position of light emitters within a laser stack are more accurate than if the laser stack is only soldered, resulting in reduction of manufacturing costs via the ability to more reliably join a laser stack with a prefabricated cooler and lens array. Furthermore, by choosing a nominal total height of a laser stack, the tolerances of individual components can be compensated for in each sinter layer of the laser stack. Specifically, because the laser stack can be collapsed to an absolute value during sintering, tolerances of the individual subcomponents of the laser stack (e.g., laser diodes, submounts, and insulators) can be compensated for by varying a compression of sinter material provided in the third and fourth joining methods, thereby ensuring a completed laser stack has a lower tolerance closer to a fixed dimensional value. The result is a laser stack with very repeatable pitch distances within and throughout the laser stack. In experimental laser stacks produced according to the present disclosure, local tolerances of 2 to 20 micrometers have been achieved, representing a significant improvement over local tolerances seen in conventional laser stack manufacturing.

FIGS. 1a and 1b illustrate emitter subassemblies according to an embodiment of the disclosure. In particular, FIG. 1a illustrates a first emitter subassembly 10 comprising a laser diode 12 joined to a submount 14. The laser diode 12 has a substantially planar configuration and emits light along an emitting edge in an emitting direction 13 away from the emitting edge of the laser diode 12. Although the laser diode 12 generally emits light in the emitting direction, it will be readily understood that light emitted from laser diode 12 is not focused in an exact direction, as light rays are emitted in a scattered fashion from the emitting edge. The emitting direction 13 thus represents a generalized direction for purposes of describing embodiments of the present disclosure, and is not understood to represent the direction of all light emitted from laser diode 12.

The submount 14 is a structural member configured to receive a laser diode 12 and provide structural rigidity to a laser stack created using emitter subassemblies, as will be described in greater detail hereafter. In addition to providing structural rigidity and a mounting surface for a laser diode 12, the submount also serves to transfer heat from a laser diode while protecting the laser diode from the external environment. Thus, the submount 14 is preferably formed from a material with a very high thermal conductivity to transfer heat away from the laser diode 12. Furthermore, the submount 14 is configured such that only low mechanical stresses occur between the laser diode 12 and the submount 14 to which it is joined, as will be described hereafter. The submount 14 may comprise copper tungsten (CuW) or other materials with similar properties to copper tungsten or as described above. The submount 14 also includes an opening through which a mounted laser diode 12 may emit light.

A laser diode 12 may be joined to the submount 14 via a variety of processes. In an embodiment, the laser diode 12 is joined to the submount 14 via sintering. This ensures rigid joining of the laser diode 12 to the submount 14, strong thermal conduction between the laser diode 12 and submount 14, and greater precision in tolerances of an assembled first emitter subassembly 10 than are achieved in other processes, such as soldering. The laser diode 12 may be joined to the submount 14 on a P-side (or anode) of a laser diode comprising the laser diode 12.

FIG. 1b illustrates a second emitter subassembly 16. The second emitter subassembly 16 is similar to the first emitter subassembly 10 in that it likewise includes a laser diode 12 mounted to a submount 14. However, the second emitter subassembly further comprises a second submount 14, thereby sandwiching a laser diode 12 between submounts 14. As a result, the second emitter subassembly as a stand-alone unit encases a laser diode while providing an opening through which the emitting edge of the laser diode 12 may emit light. In some embodiments, the laser diode 12 may be joined to the second submount 14 of the second emitter subassembly 16 on an N-side (or cathode) of the laser diode 12.

FIG. 1c illustrates a laser stack 18 according to an embodiment of the disclosure. The laser stack 18 includes a series of first emitter subassemblies 10 joined together in parallel so that all emitting edges of the first emitter subassemblies face the same general direction on one face of the stack. The stack is formed so that the light output of each emitter subassembly may be combined and concentrated in a smaller footprint to form a high power laser. In some embodiments, a laser stack 18 may instead be configured to include a series of second emitter subassemblies 16 joined together, with adjacent second emitter subassemblies 16 being joined via their submounts 14. Both embodiments of laser stacks will be described in greater detail hereafter in FIGS. 3a-3b.

FIG. 2 illustrates a cooler 20 according to an embodiment of the disclosure. The cooler includes a plurality of metallized contacts 22 for transferring heat from first or second emitter subassemblies 10, 16 to the body of the cooler 20. The metallized contacts 22 are made of a thermally conductive material, and any thermally conductive material may be used so long as it is sufficiently thermally conductive so as to transfer heat away from the first or second emitter subassemblies 10, 16 to the body of the cooler 20 based on the amount of heat produced by the emitter subassemblies 10, 16. The cooler may use cooling fluid circulated within the body of cooler 20 to then transfer heat away from both the cooler 20 and a laser stack. The evenly-spaced metallized contacts 22 of the cooler are configured to match with the spacing of first or second emitter subassemblies within a laser stack, as described in greater detail hereafter with reference to FIGS. 3a-3d, so that each metallized contact 22 is aligned with a corresponding emitter subassembly.

Figure 3A:
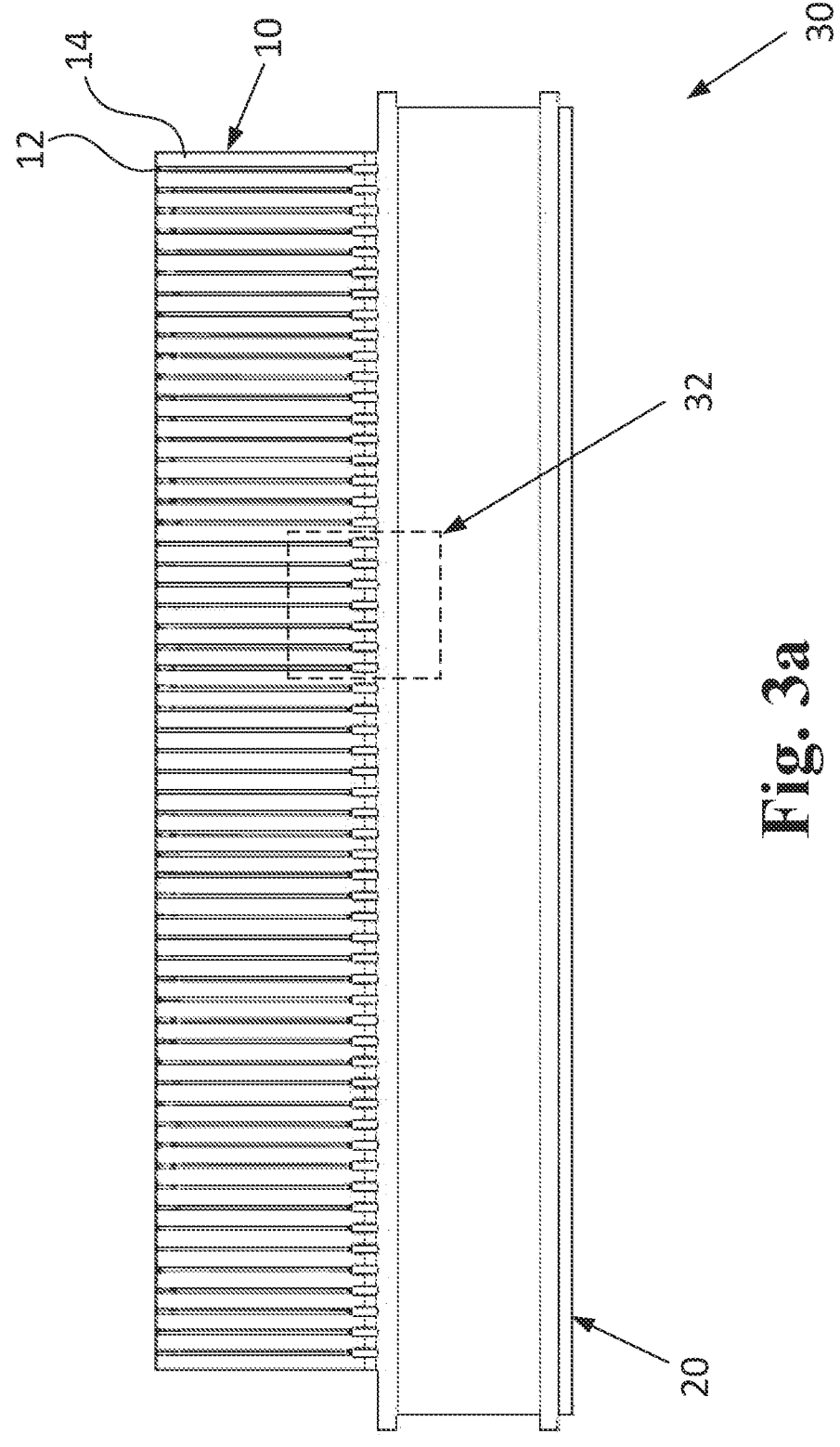
Figure 3B:
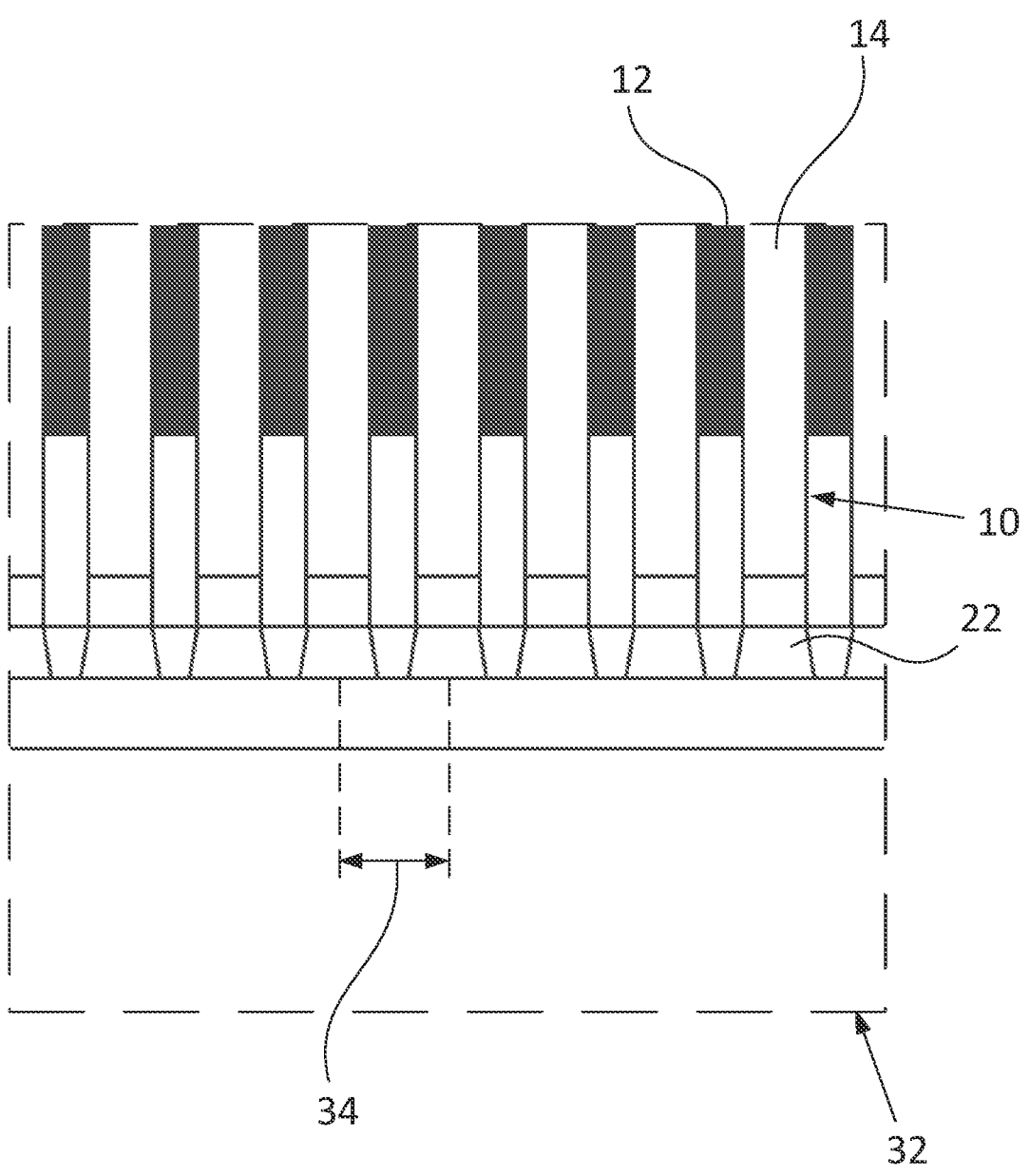

FIG. 3a illustrates a cross-sectional view of a QCW laser 30 comprised of first emitter subassemblies 10 joined adjacent to one another and in parallel. The first emitter subassemblies are also joined to a cooler 20 via metallized contacts 22. FIG. 3a also illustrates a detailed view 32 that is enlarged and shown in FIG. 3b. As shown in FIG. 3b, each first emitter subassembly 10 is configured to contact a metallized contact 22. The first emitter subassemblies 10 and metallized contacts 22 are arranged with even spacing (referred to hereinafter as a first pitch 34) between adjacent first emitter subassemblies 10) and metallized contacts 22, respectively. A consistent or repeated pitch between adjacent first emitter subassemblies 10 and between adjacent metallized contacts 22 is important for ensuring high thermal performance of the cooler 20, as misalignment between first emitter subassemblies 10 and metallized contacts 22 may lead to reduced heat transfer away from laser diodes 12, thereby causing laser damage, malfunction, or suboptimal laser performance. In other words, each pitch between adjacent subassemblies may be equidistant from an adjacent pitch. As shown in FIG. 3b, the first pitch 34 is representative of a distance from one reference point of a first emitter subassembly 10 to the same reference point on an adjacent first emitter subassembly 10. The first pitch 34 is likewise representative of a distance from one reference point of a first metallized contact 22 of the cooler 20 to the same reference point on an adjacent metallized contact 22. Although FIG. 3b illustrates that the first pitch 34 is a distance between center points of components, it will be readily understood that the first pitch 34 may likewise be measured or represented as the same distance using different reference points of either the first emitter subassemblies 10 or the metallized contacts 22.

Figure 3C:
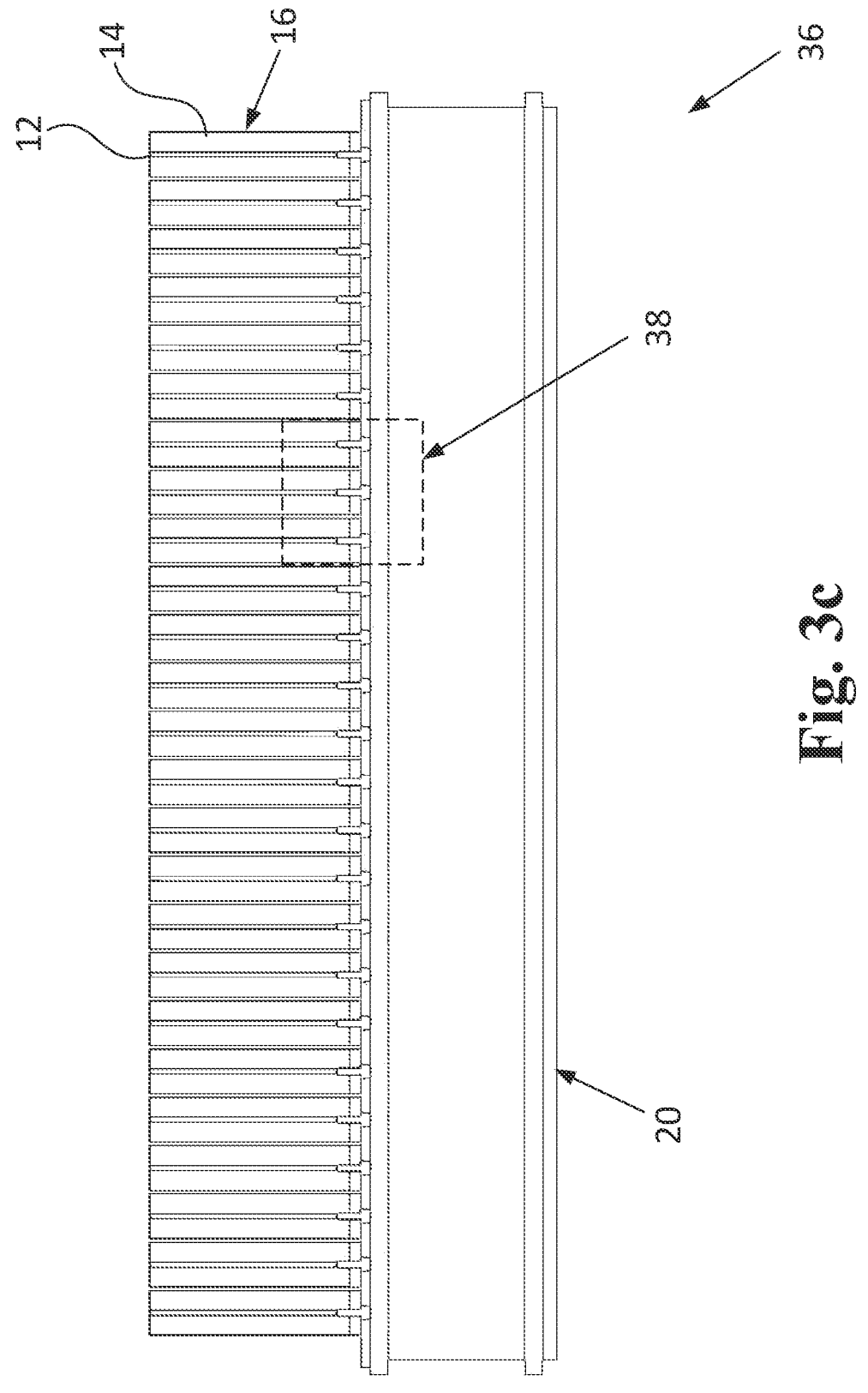
Figure 3D:
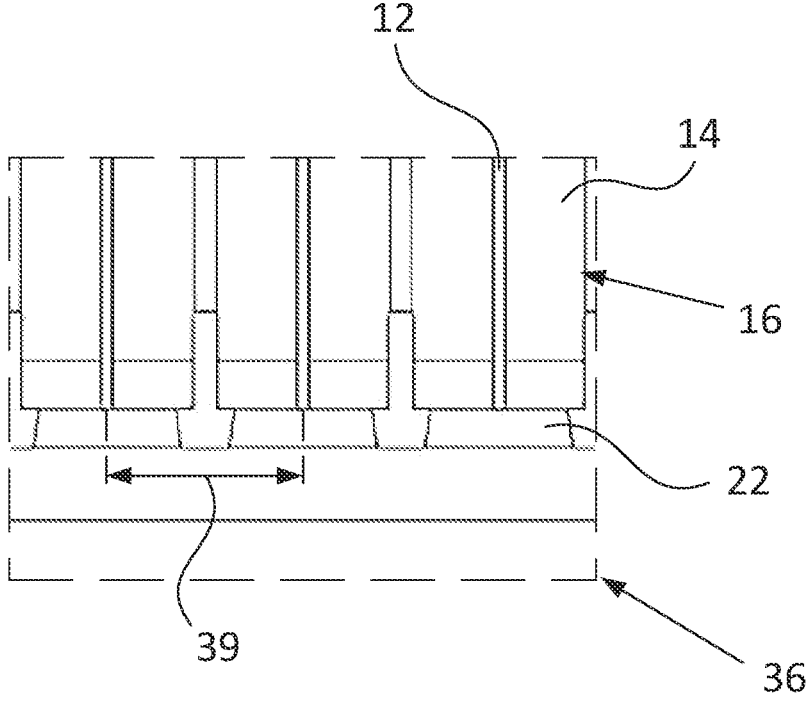

FIG. 3c illustrates a cross-sectional view of a QCW laser 36 comprised of second emitter subassemblies 16 joined adjacent to one another and in parallel. The second emitter subassemblies 16 are also joined to a cooler 20 via metallized contacts 22. FIG. 3c also illustrates a detailed view 38 that is enlarged and shown in FIG. 3d. As shown in FIG. 3d, each second emitter subassembly 16 is configured to contact a metallized contact 22. The second emitter subassemblies 16 and metallized contacts 22 are arranged with a second pitch 39 between adjacent second emitter subassemblies 16 and metallized contacts 22, respectively. As with the embodiment illustrated in FIGS. 3a and 3b, the consistent pitch between adjacent second emitter subassemblies 16 and between adjacent metallized contacts 22 ensures optimal thermal performance of the cooler 20. As shown in FIG. 3d, the second pitch 39 is representative of a distance from one reference point of a second emitter subassembly 16 to the same reference point on an adjacent second emitter subassembly 16. The second pitch 39 is also representative of the distance from one reference point of a first metallized contact 22 of the cooler 20 to the same reference point on an adjacent metallized contact 22.

FIGS. 4a-4b illustrate lens arrays according to embodiments of the disclosure. Specifically, FIG. 4a illustrates a perspective view of a lens array 40 with a plurality of lenses 42 arranged adjacent to one another and in parallel, while FIG. 4b illustrates a cross-sectional view of a lens array 40. The lens array 40 is configured to be mounted onto a QCW laser (e.g. QCW lasers 30, 36 of FIGS. 3a and 3c) to align with emitting edges formed by first or second emitter subassemblies. The lenses 42 of lens array 40 are arranged adjacent to one another with a pitch 44 consistent with the pitch of the subassemblies (e.g. first pitch 34 or second pitch 39 of FIGS. 3b and 3d) of the QCW laser to which it is mounted. Because the pitch of lenses 42 is equal to the pitch of emitter subassemblies, the lens array 40 may be mounted with relative ease in comparison to conventional systems and methods in which lenses are instead mounted individually. The process of mounting lenses individually is especially labor- and/or resource-intensive when the pitch between emitter subassemblies is small, for example approximately only 0.5 mm. Furthermore, the use of a replicable pitch between emitter subassemblies, metallized contacts, and lenses reduces production costs by enabling production of lens arrays and eliminating the need to separately join or mount lenses to one another and/or to the QCW laser.

FIGS. 4a-4b are understood to be illustrative and do not depict exact dimensions of individual lenses 42 or of a lens array 40. Rather, lens array 40 may be configured in a variety of sizes with varying numbers of lenses 42 based on the particular specifications of a QCW laser. Likewise, individual lenses 42 may have varying dimensions based on a particular specification of a QCW laser.

FIGS. 5a-5b illustrate an electron microscope scan 50 of emitter subassemblies joined via sintering according to an embodiment of the disclosure. In FIG. 5a, a plurality of laser diodes 52 and submounts 54 are shown that are joined with sintering preform 58, which is shown in more detail in detailed view 56, which is the basis for the enlarged scan shown in FIG. 5b. FIG. 5b illustrates a sintering preform 58 arranged between a laser diode 52 and a submount 54. The sintering preform 58 includes a solid silver layer 62 between two silver sinter film layers 60, 64. The three-layer sintering preform 58 is configured to be arranged between a laser diode 52 and submount 54 prior to a laser stack being compressed and heated. FIG. 5b also illustrates a silver tin solder joint 66 for comparative purposes. The silver tin solder joint 66 may include voids formed as the result of a traditional soldering process. These voids can be irregular in size and shape, thus causing variation in soldered joints throughout a laser stack. Furthermore, different compositions of silver and tin are visible after reflow having irregular shapes and/or layering. Thus, laser stacks formed using soldering instead of sintering may have overall dimensional tolerances that are too large to mount a single lens array 40. Likewise, laser stacks formed using soldering instead of sintering may include variations in pitch between emitter subassemblies that make them unsuitable for mounting to a prefabricated cooler 20 or lens array 40. In comparison, joints formed from a sintering preform include more predictable and regular pore sizes, providing for greater precision when manufacturing a laser stack with tight tolerances. The resulting tolerances achieved via sintering versus soldering enable a consistent pitch to be achieved across emitter subassemblies, thereby further enabling the separate manufacture of lens arrays and coolers with the same pitch. Furthermore, the overall dimensional tolerance of a finished laser stack may be more tightly controlled by varying compressive forces (measured as a compression ratio) applied to a laser stack during sintering, thereby compensating for variations in the size of subcomponents such as laser diodes and submounts, and also for variations in the size of emitter subassemblies.

The arrangement of laser diodes 52 and submounts 54 in FIGS. 5a and 5b are illustrative of sintering processes and joints as described in embodiments of the present disclosure, but are not to be understood as exactly representing an electron microscope scan of a completed laser stack. Similarly, the inclusion of a soldered joint in FIGS. 5a and 5b is for comparative and illustrative purposes, whereas a laser stack formed in embodiments of the present disclosure may not include any soldered joints.

In some embodiments, sintering preforms of different composition and type may be used to achieve similar highly precise joints. For example, a single film (such as, for example, a single silver sinter film) may be used instead of a three-layer preform. In some embodiments, a sintering paste may be applied between laser diodes and submounts and/or between emitter subassemblies. In some embodiments, a sintering foil may be used. In some embodiments, copper and/or gold may be used as a sintering material. It will be readily understood that various compounds or elements may be used as nano-particles that form the basis for sintering materials. Regardless of the means for providing sintering material prior to compression and heating or the particular composition thereof, embodiments of the present disclosure achieve high-precision pitch tolerances via sintering, and it will be readily understood that the process of sintering may include some variation in how sintering materials are provided between components and how they are subsequently fused to form a sintered joint.

In some embodiments, additional systems and method steps may be implemented to ensure that laser stacks are sintered properly. For example, pressure sensors may be used to monitor the pressure applied to opposite ends of a laser stack during sintering to ensure that pressure is applied evenly on opposite sides of a laser stack to provide even compression. Because angled pressure application during compression can cause misalignment of emitter subassemblies and/or subcomponents, quality control may be more readily performed to reduce manufacturing defects before they occur or to reject parts known to have been sintered using uneven pressure application. Pressure sensors may also be used to ensure that a proper compression ratio is maintained during sintering. In some embodiments, a compression ratio of 20-50% is used during sintering of laser stacks.

In some embodiments, temperature sensors may be used to monitor the temperature of a laser stack during sintering, thereby enabling monitoring of temperatures to ensure all parts of the laser stack achieve a temperature sufficient for completing the sintering process for a sufficient duration of time. Internal, surface, and environmental temperature monitoring may also be utilized to prevent outgassing during sintering. In some embodiments, a clamp, press, or vice used to compress the laser stack for sintering is preheated to encourage propagation of heat to the inner portions of a laser stack, thereby reducing the time required to achieve sintering temperatures in the innermost portions of a laser stack. For example, a press comprising two hot plates may be used, with one hot plate being configured to lower toward the other hot plate to compress a laser stack.

In some embodiments, pitches between emitter subassemblies in a laser stack may be variable, but predefined. In such embodiments, a lens array is also configured with variable pitches between individual lenses to match the predefined pitches of the laser stack. In this manner, a lens array may still be used even if pitches are not equidistant from one another, because joining emitter subassemblies via sintering can be carried out with sufficient precision to allow for mounting of a lens array with a matching pitch configuration. In some embodiments, more than one lens array may be mounted onto a laser stack instead of just a single lens array. For example, each lens array mounted on a laser stack may comprise two or more lenses each with a predefined pitch or predefined variable pitches between lenses. The predefined pitch or predefined variable pitches are configured to match the predefined pitch or predefined variable pitches within a particular laser stack so that individual mounting of lenses is not required, but more than one lens array may be required. In this manner, a more versatile range of lasers may be produced by the methods disclosed herein. While use of variable pitches and/or two or more lens arrays increases the customizability of laser stacks and increases the feasible range of laser products that may be manufactured, cost and time savings are still achieved by eliminating the need for mounting of individual lenses.

It will thus be readily appreciated that a predefined pitch pattern may be used to define the distance or distances with which pitch emitter subassemblies, lenses of lens arrays, and metallized contacts will be arranged relative to one another. In some embodiments, the predefined pitch pattern is simply a repeated pitch or a pattern that defines distances between components which are all equal, as described above with reference to FIGS. 3a-3d and/or FIGS. 4a-4b. This has the advantage of providing a simpler pattern that may require fewer lens arrays, may provide for larger laser stacks to be produced while maintaining allowable overall tolerances, and may reduce costs by reducing complexity. In some embodiments, the predefined pitch pattern defines distances between components which are variable. Because the predefined pitch pattern is used to define distances between emitter subassemblies that match distances between lenses in one or more lens arrays, and because the same predefined pitch pattern may also be used to define distances between metallized contacts, a laser stack may still be produced without having to individually mount lenses. This has the advantage of providing cost and time savings when producing a laser stack while also enabling production of more complex laser stacks.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C

What is claimed is:
1. A light emitting device, comprising:
a plurality of emitter subassemblies, each emitter subassembly comprising:
a plate-shaped light emitter having two sides and configured to emit light from an edge disposed between the two sides, and
at least one plate-shaped submount attached to at least one side of the plate-shaped light emitter, wherein the plurality of emitter subassemblies is disposed parallel to one another and sintered to one another in such a manner as to form a light emitting diode stack with a predefined pitch pattern;

a lens array mounted on the light emitting diode stack; and a cooler joined with the light emitting diode stack, the cooler having a plurality of cooling contacts arranged in parallel to one another and with relative distances from one another defined by the predefined pitch pattern such that each of the plurality of cooling contacts is aligned with a respective one of the plurality of emitter subassemblies, wherein the lens array includes a plurality of lenses combined as a single unitary body, and wherein distances between the lenses correspond to the distances defined by the predefined pitch pattern such that each of the plurality of lenses is aligned with a corresponding one of the plate-shaped light emitters.

2. The light emitting device of claim 1, wherein each of the plurality of emitter subassemblies includes two plate-shaped submounts, each attached to one of the two sides of a respective plate-shaped light emitter.

3. The light emitting device of claim 1, wherein each of the plurality of emitter subassemblies includes one plate-shaped submount attached to one of two sides of a respective plate-shaped light emitter, and wherein the sintering between each of the plurality of emitter subassemblies is between another of the two sides of each plate-shaped light emitter and a respective plate-shaped submount of an adjacent emitter subassembly.

4. The light emitting device of claim 1, further comprising a sintered material between each of the emitter subassemblies.

5. The light emitting device of claim 4, wherein the sintered material comprises sintered silver.

6. A light emitting device, comprising:

a plurality of emitter subassemblies, each emitter subassembly comprising:

a plate-shaped light emitter having two sides and configured to emit light from an edge disposed between the two sides, and at least one plate-shaped submount attached to at least one side of the plate-shaped light emitter, wherein the plurality of emitter subassemblies is disposed parallel to one another and sintered to one another in such a manner as to form a light emitting diode stack, wherein a predefined pitch pattern defines distances between adjacent emitter subassemblies; and a cooler joined with the light emitting diode stack, the cooler having a plurality of cooling contacts arranged in parallel to one another and with relative distances from one another defined by the predefined pitch pattern such that each of the plurality of cooling contacts is aligned with a respective one of the plurality of emitter subassemblies.

7. A method for forming a light emitting device, the method comprising:

providing a plurality of plate-shaped light emitters, each having two sides and being configured to emit light from an edge disposed between the two sides;

providing a plurality of plate-shaped submounts;

joining each of the plurality of plate-shaped light emitters on at least one of two sides of the plurality of plate-shaped submounts so as to form a plurality of emitter subassemblies;

arranging the plurality of emitter subassemblies adjacent to and in parallel to one another;

sintering each of the plurality of emitter subassemblies together to form a light emitting diode stack, the sintered emitter subassemblies being disposed with one or more predefined pitches relative to one another; and joining the sintered light emitting diode stack to a cooler, the cooler having cooling contacts arranged in parallel to one another and with the one or more predefined pitches between cooling contacts corresponding to the one or more predefined pitches such that each of the cooling contacts are aligned with a respective one of the emitter subassemblies.

8. The method of claim 7, further comprising mounting a lens array to the light emitting diode stack, the lens array comprising a plurality of lenses combined as a unitary body and arranged with the one or more predefined pitches between the lenses corresponding to the one or more predefined pitches of the sintered emitter subassemblies.

9. The method of claim 7, further comprising providing a sinter preform between each emitter subassembly.

10. The method of claim 9, wherein the each sinter preform comprises a solid silver layer between two silver sinter film layers.

11. The method of claim 7, further comprising:

determining a dimensional value of at least one dimension of the light emitting diode stack; and based on the determined dimensional value, varying a compression ratio applied to the light emitting diode stack during sintering of the emitter subassemblies to one another.

12. The method of claim 7, further comprising providing a sinter film between each emitter subassembly.

13. The method of claim 7, further comprising providing a sinter paste between each emitter subassembly.

14. The method of claim 7, wherein the cooler and the lens array are each separately prefabricated.

15. The method of claim 7, wherein the joining step includes joining each of the plurality of plate-shaped light emitters to one of the plurality of plate-shaped submounts such that the light emitting diode stack includes each of the plurality of plate-shaped light emitters and each of the plurality of plate-shaped submounts disposed in an alternating pattern.

16. The method of claim 7, wherein the joining step includes joining each of the plurality of plate-shaped light emitters between two of the plurality of plate-shaped submounts.

17. The method of claim 7, further comprising preheating two plates prior to sintering of the emitter subassemblies, wherein the two plates are configured to compress the emitter subassemblies toward one another during sintering.

* * * * *